(12) United States Patent
Ebe et al.

(10) Patent No.: US 7,829,880 B2
(45) Date of Patent: Nov. 9, 2010

(54) QUANTUM DOT SEMICONDUCTOR DEVICE

(75) Inventors: Hiroji Ebe, Kanagawa (JP); Kenichi Kawaguchi, Kawasaki (JP); Ken Morito, Kawasaki (JP); Yasuhiko Arakawa, Kanagawa (JP)

(73) Assignees: Fujitsu Limited, Kawasaki (JP); The University of Tokyo, Tokyo (JP)

( * ) Notice: Subject to any disclaimer, the term of this patent is extended or adjusted under 35 U.S.C. 154(b) by 226 days.

(21) Appl. No.: 12/047,806

(22) Filed: Mar. 13, 2008

(65) Prior Publication Data

US 2008/0308788 A1   Dec. 18, 2008

(30) Foreign Application Priority Data

Mar. 28, 2007 (JP) .............................. 2007-084129

(51) Int. Cl.
*H01L 29/06* (2006.01)
*H01L 31/00* (2006.01)

(52) U.S. Cl. ............ 257/9; 257/14; 257/E29.071; 257/E29.245; 257/E31.033; 257/E33.008; 438/962

(58) Field of Classification Search ............... 257/9, 257/14, E29.068, E29.071, E29.245, E31.033, 257/E33.008; 438/962
See application file for complete search history.

(56) References Cited

U.S. PATENT DOCUMENTS

| 6,859,477 | B2 | 2/2005 | Deppe et al. | |
|---|---|---|---|---|
| 2006/0220001 | A1* | 10/2006 | Uetake et al. | 257/14 |
| 2007/0194299 | A1* | 8/2007 | Yasuoka et al. | 257/17 |

FOREIGN PATENT DOCUMENTS

| JP | 2003-23219 A | 1/2003 |
|---|---|---|
| JP | 2003-124574 A | 4/2003 |

* cited by examiner

*Primary Examiner*—Long K Tran
(74) *Attorney, Agent, or Firm*—Westerman, Hattori, Daniels & Adrian, LLP

(57) ABSTRACT

A quantum dot semiconductor device includes an active layer having a plurality of quantum dot layers each including a composite quantum dot formed by stacking a plurality of quantum dots and a side barrier layer formed in contact with a side face of the composite quantum dot. The stack number of the quantum dots and the magnitude of strain of the side barrier layer from which each of the quantum dot layers is formed are set so that a gain spectrum of the active layer has a flat gain bandwidth corresponding to a shift amount of the gain spectrum within a desired operation temperature range.

11 Claims, 10 Drawing Sheets

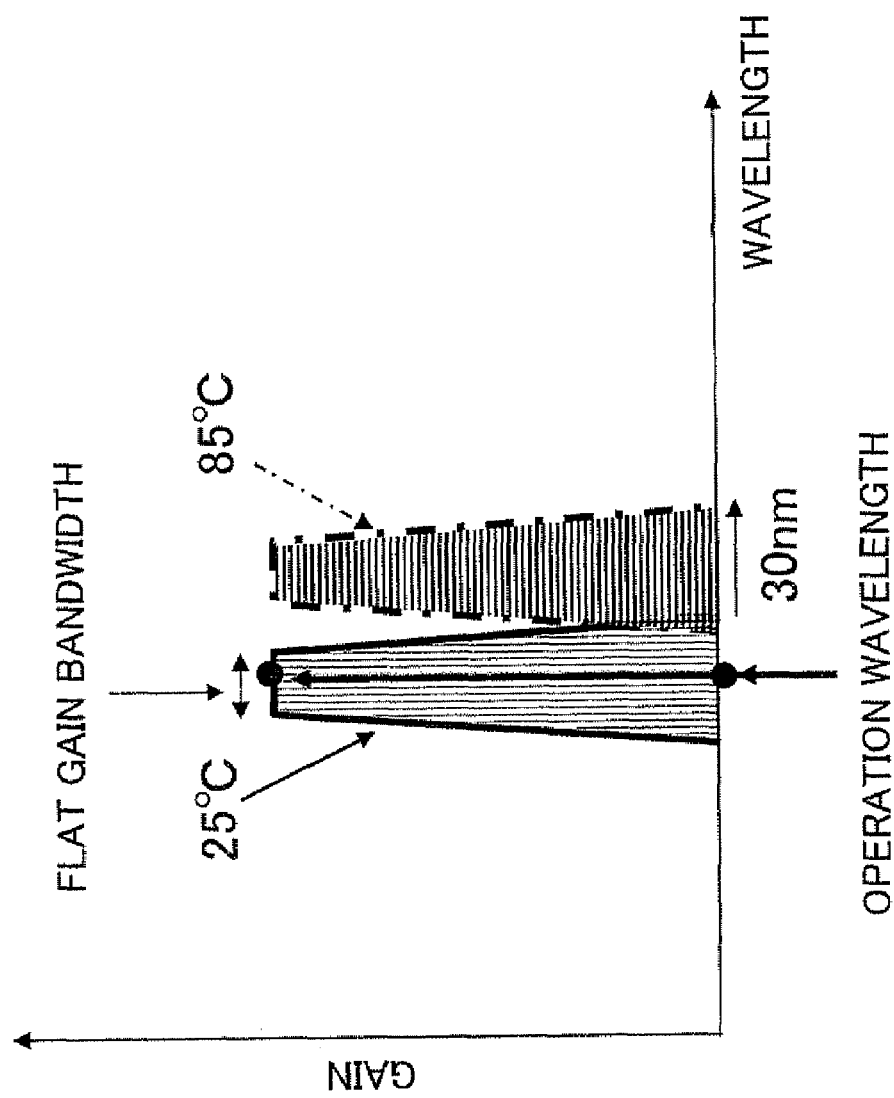

2ndQW
1stQW

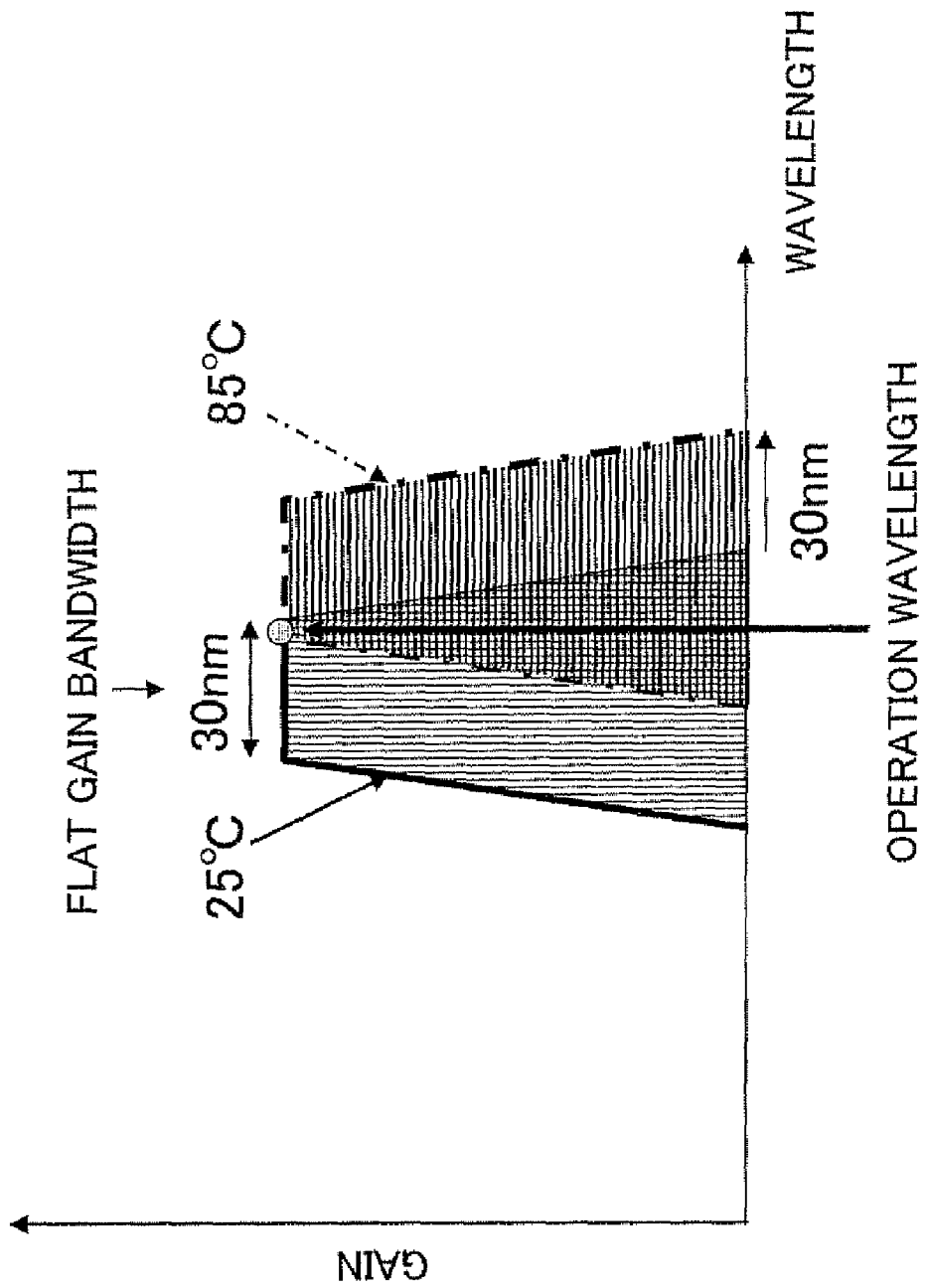

FIG. 8

| | | POINT A | POINT B |
|---|---|---|---|
| MAGNITUDE OF STRAIN OF SIDE BARRIER LAYER | | 1.5% | 2.0% |
| HEIGHT OF COMPOUND QUANTUM DOT | | 13nm | 11nm |
| ENERGY GAP WAVELENGTH (nm) | HH | 1565nm | 1505nm |
| | LH | 1560nm | 1519nm |
| HALF VALUE WIDTH (meV) OF GAIN SPECTRUM | HH | 27meV | 33meV |
| | LH | 31meV | 40meV |

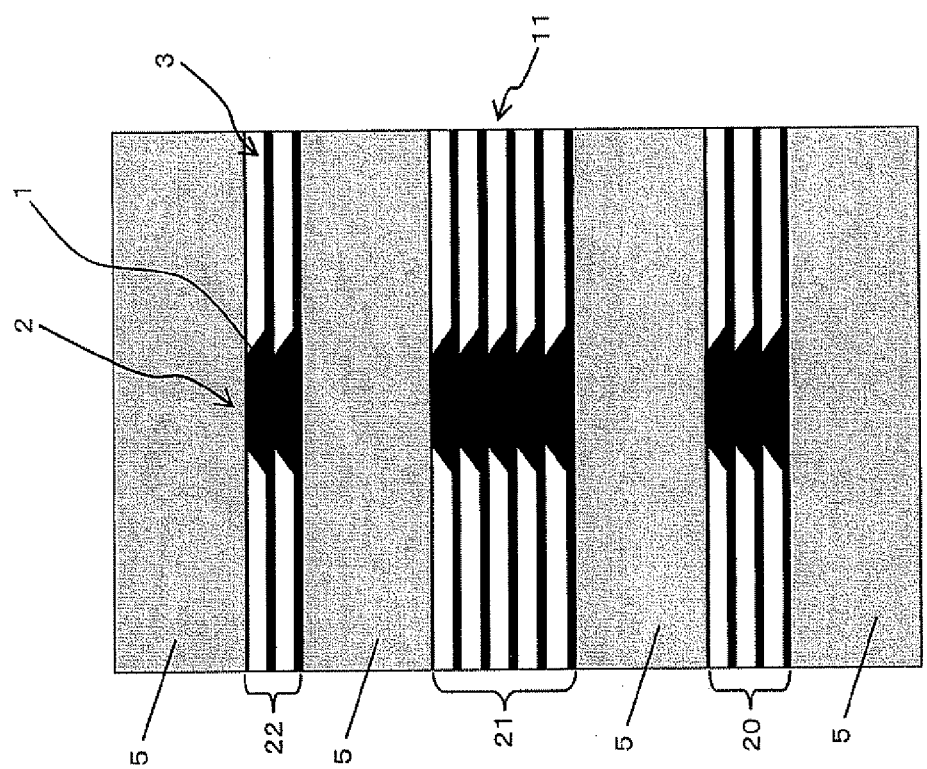

QUANTUM DOT SEMICONDUCTOR DEVICE

CROSS REFERENCE TO RELATED APPLICATION

This application is based on and hereby claims priority to Japanese Application No. 2007-084129 filed on Mar. 28, 2007 in Japan, the contents of which are hereby incorporated by reference.

BACKGROUND

1) Field

The embodiment relates to a quantum dot semiconductor device for use, for example, with an optical communication system, and particularly to a quantum dot semiconductor device suitable for use with a semiconductor optical amplifier (SOA) in which a quantum dot is used.

2) Description of the Related Art

In recent years, a semiconductor optical amplifier and a semiconductor laser get much attention in the field of optical communications because they are small in size and low in power consumption.

On the other hand, semiconductor devices such as semiconductor optical amplifiers or semiconductor lasers require an uncooled configuration to achieve further reduction of power consumption.

However, it is difficult to achieve an uncooled configuration in a quantum well semiconductor device wherein a quantum well is used in an active layer.

In particular, since a quantum well semiconductor device has a continuous gain band and has a temperature dependency of the carrier distribution, the gain varies greatly depending upon the operation temperature. On the other hand, if injection current is increased in order to inject sufficient carriers, then the power consumption increases. Further, since the device temperature rises by increase of the injection current, there is a limitation to the increase of the injection current as well. Therefore, it is difficult to achieve an uncooled configuration for a quantum well semiconductor device.

On the other hand, a conventional semiconductor device wherein a quantum dot is used in an active layer is not desirable to achieve an uncooled configuration because it is sensitive to the temperature. Therefore, a method has been proposed wherein p-type impurity layer is formed in an active region to shift the Fermi energy to the high energy side thereby to reduce the variation amount of the carrier distribution by variation of the device temperature so that the temperature characteristic of the gain is improved (refer to, for example, U.S. Pat. No. 6,859,477).

Also a method has been proposed wherein, in order to accelerate relaxation of carriers to a ground level of a quantum dot in a quantum dot semiconductor device, p-type impurity is included into an active layer (refer to, for example, Japanese Patent Laid-Open No. 2003-23219).

Incidentally, regarding a quantum dot semiconductor device, a method has been proposed which utilizes the fact that a plurality of quantum dots are non-uniform in size in order to expand the gain band so that broadband WDM (Wavelength Division Multiplexing) signals can be amplified collectively (refer to Japanese Patent Laid-Open No. 2003-124574).

SUMMARY

The embodiment provides that a quantum dot semiconductor device includes an active layer having a plurality of quantum dot layers each including a composite quantum dot formed by stacking a plurality of quantum dots and a side barrier layer formed in contact with a side face of the composite quantum dot, the stack number of the quantum dots and the magnitude of strain of the side barrier layer from which each of the quantum dot layers is formed being set so that a gain spectrum of the active layer has a flat gain bandwidth corresponding to a shift amount of the gain spectrum within a desired operation temperature range.

BRIEF DESCRIPTION OF THE DRAWINGS

FIGS. 3, 4, 5(A) and 5(B) are views illustrating a subject to be solved by the embodiment;

FIG. 6 is a diagram illustrating a gain spectrum having a flat gain bandwidth corresponding to a desired operation temperature range of the quantum dot semiconductor device according to the embodiment;

FIG. 8 is a view illustrating a configuration of quantum dot layers provided in the quantum dot semiconductor device according to the embodiment;

FIG. 10 is a schematic sectional view showing a configuration of part of a modification to the quantum dot semiconductor device of the embodiment.

DESCRIPTION OF THE PREFERRED EMBODIMENT

In the following, a quantum dot semiconductor device according to an embodiment is described with reference to FIGS. 1 to 10.

The quantum dot semiconductor device according to the present embodiment is a quantum dot semiconductor optical amplifier (herein after referred to as quantum dot SOA).

Figure 2:
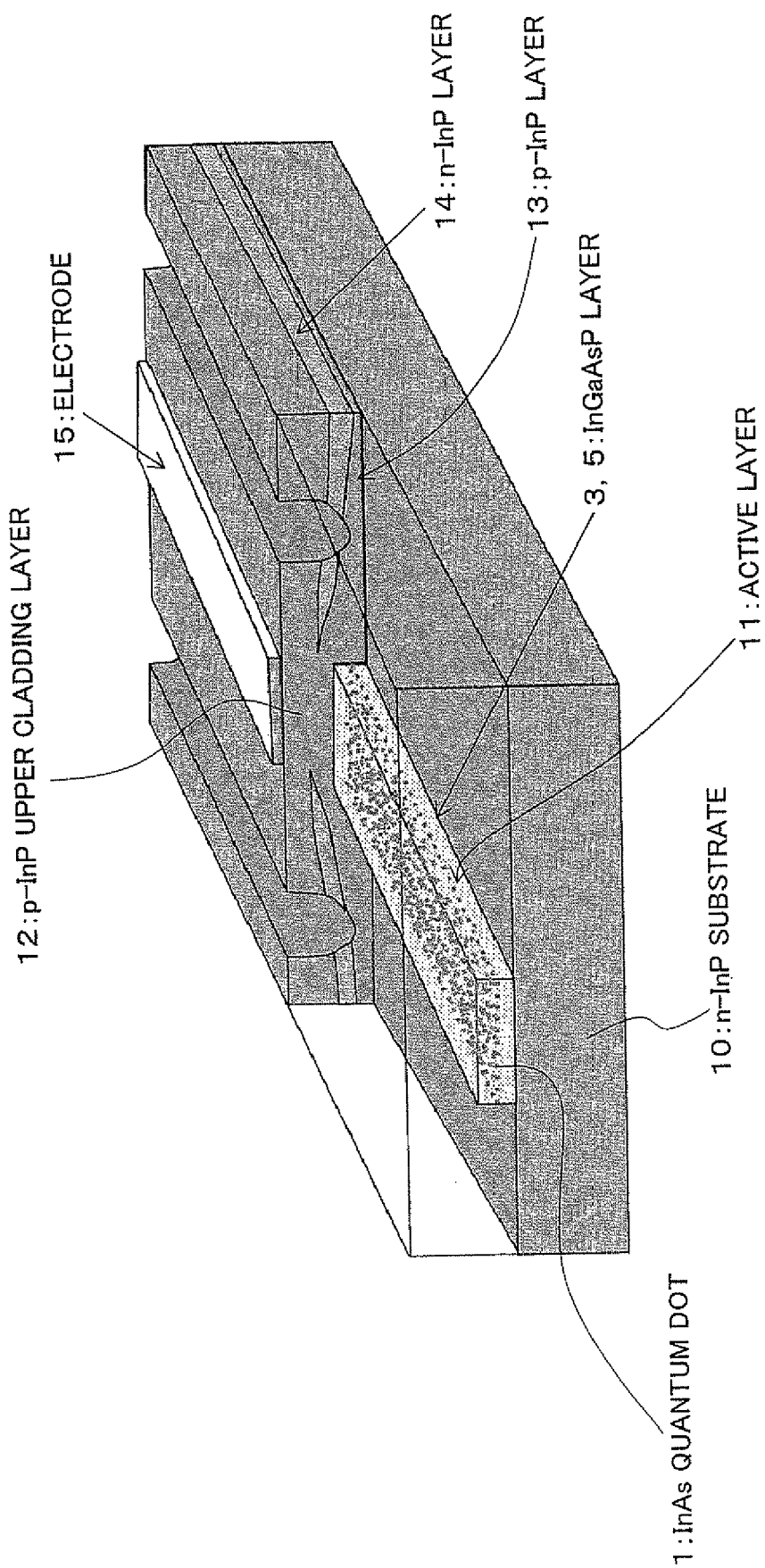
FIG. 2 is a schematic perspective view showing a general configuration of the quantum dot semiconductor device according to the embodiment.

As shown in FIG. 2, the quantum dot SOA is configured as a device which includes an active layer (quantum dot active layer) 11 provided on a semiconductor substrate (here, n-type InP substrate) 10 and having quantum dots (here, InAs quantum dots) 1 buried in InGaAsP layers (side barrier layers 3 and barrier layers 5).

In particular, as shown in FIG. 2, the quantum dot SOA is configured as a buried waveguide type quantum dot SOA which includes a buffer layer (not shown) provided as occasion demands, a lower cladding layer (here, an n-type InP layer; not shown), the quantum dot active layer 11, an upper cladding layer (here, a p-type InP layer) 12, current blocking layers (here, a p-type InP buried layer 13 and an n-type InP buried layer 14), a contact layer (here, a p-type InP layer; not shown) and an electrode (p-side electrode) 15, which are provided on the semiconductor substrate 10.

It is to be noted that, though not shown, an electrode (n-side electrode) is formed on the back face side of the substrate, and further, an AR (Anti-Reflection) coat film (reflection preventing film) is formed on both end faces of the substrate. Further, in order to reduce end face reflection, an oblique waveguide is formed by obliquely forming the quantum dot active layer 11 as a waveguide core.

Figure 1:
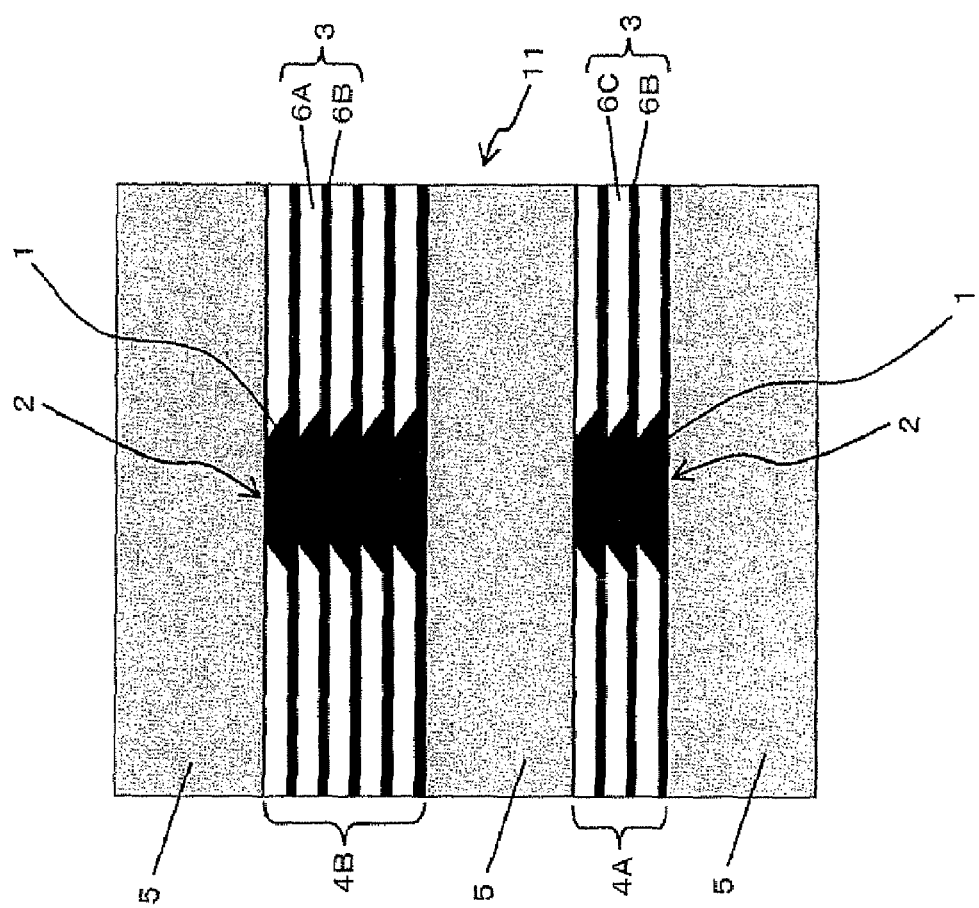
FIG. 1 is a schematic sectional view showing a configuration of part of a quantum dot semiconductor device according to an embodiment.

In the present embodiment, as shown in FIG. 1, the quantum dot active layer 11 includes a plurality of (here, two) quantum dot layers 4A and 4B and barrier layers (here, InGaAsP barrier layers) 5 provided on the upper and lower portions of the quantum dot layers 4A and 4B, and has a structure wherein the plural quantum dot layers 4A and 4B are stacked with a barrier layer 5 interposed therebetween.

Here, as shown in FIG. 1, the quantum dot layers 4A and 4B individually include a composite quantum dot (columnar quantum dot) 2 formed by stacking a plurality of quantum dots (here, InAs quantum dots) 1 and a side barrier layers 3 (here, InGaAsP side barrier layers 6A or 6C and InAs wetting layers 6B) formed in contact with the side faces of the composite quantum dot 2.

It is to be noted that, while, in order to simplify the illustration, one quantum dot layer 4A is shown as a stack of three quantum dots 1 and the other quantum dot layer 4B is shown as a stack of five quantum dots 1 in FIG. 1, actually the quantum dot layer 4A is formed from a stack of eleven quantum dots 1 while the quantum dot layer 4B is formed from a stack of thirteen quantum dots 1 as herein after described.

Further, while, in the present embodiment, each side barrier layer 3 is configured as a layer which includes a wetting layer (here, InAs wetting layer) 6B, the side barrier layer 3 is not limited to this, but it may be configured as a layer which includes no wetting layer by forming quantum dots under such a growth condition that no wetting layer is formed.

Further, the quantum dot active layer 11 is configured so as to partly include p-type impurity. The quantum dots 1 which form the quantum dot active layer 11 may include p-type impurity or else the side barrier layers 3 may include p-type impurity, or otherwise the barrier layers 5 may include p-type impurity. It is to be noted that the active layer 11 may be configured as a layer which does not include p-type impurity.

Incidentally, in order to achieve an uncooled configuration of a quantum dot semiconductor device (here, 1.55 μm), it is necessary to prevent the gain in an operation wavelength from varying even if the temperature varies so as to compensate for the temperature dependency of the energy gap of the semiconductor material.

However, even if p-type impurity is included in an active layer in a quantum dot semiconductor device as disclosed in U.S. Pat. No. 6,859,477 or Japanese Patent Laid-Open No. 2003-23219, the temperature dependency of the energy gap of the semiconductor material cannot be compensated for. In particular, since the energy gap of the semiconductor material has a temperature dependency, the performance cannot be improved sufficiently only if p-type impurity is included in an active layer, and a desired performance cannot be obtained.

Meanwhile, Japanese Patent Laid-Open No. 2003-124574 merely utilizes the fact that quantum dots naturally become non-uniform in size upon growth thereof, and this cannot be controlled precisely. Therefore, if the temperature varies, then the gain in an operation wavelength varies.

Therefore, it is desired to prevent variation of the gain in an operation wavelength of a quantum dot semiconductor device even if the temperature varies.

Figure 3:
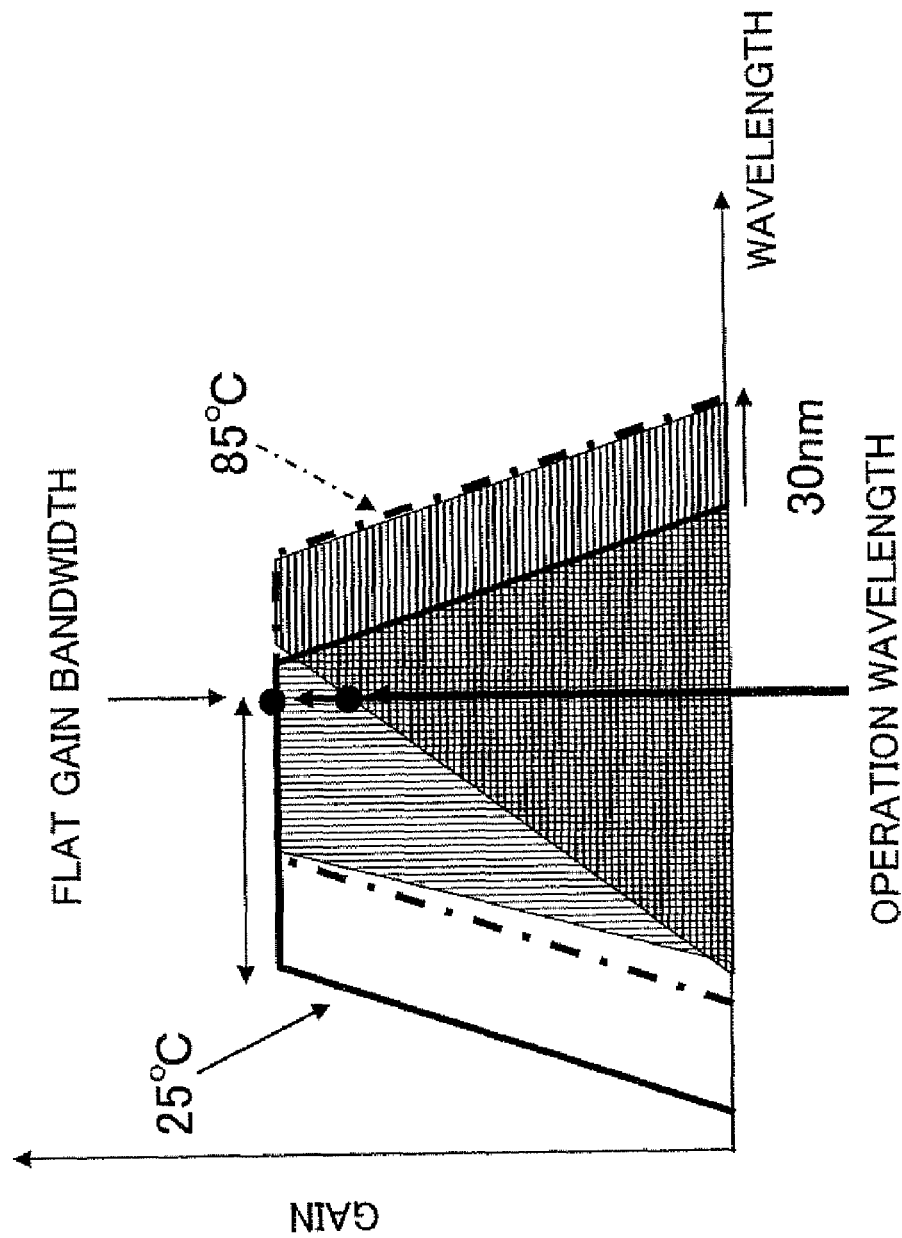

In addition, for example, in the case of a quantum well semiconductor optical amplifier (quantum well SOA) or a quantum dot SOA which has a gain spectrum whose flat gain bandwidth is excessively wide, sufficient carriers cannot be injected as seen in FIG. 3. If the temperature varies, for example, from 25° C. to 85° C., by the temperature dependency of the carrier distribution, then the energy gap of the semiconductor material varies and the wavelength (energy gap wavelength) of the semiconductor material varies by approximately 30 nm as seen in FIG. 3. Consequently, the gain in the operation wavelength varies. It is to be noted that, in FIG. 3, a region to which a pattern is applied is a region which is filled with carriers.

In this case, while it is a possible idea to increase the injection current in order to inject sufficient carriers, if the injection current is increased, then power consumption increases. Further, since the device temperature rises by increase of the injection current, there is a limitation also to increase of the injection current.

Accordingly, it is difficult to achieve an uncooled configuration in a quantum well SOA or a quantum dot SOA which has a gain spectrum whose flat gain bandwidth is excessively wide.

Further, for example, in the case of a quantum dot SOA having a gain spectrum whose flat gain bandwidth is excessively narrow, if the temperature varies, for example, from 25° C. to 85° C., then the energy gap of the semiconductor material varies and the wavelength (energy gap wavelength) thereof shifts by approximately 30 nm as seen in FIG. 4 so that the gain in the operation wavelength varies. It is to be noted that, in FIG. 4, a region to which a pattern is applied is a region filled with carriers.

Figure 5A:
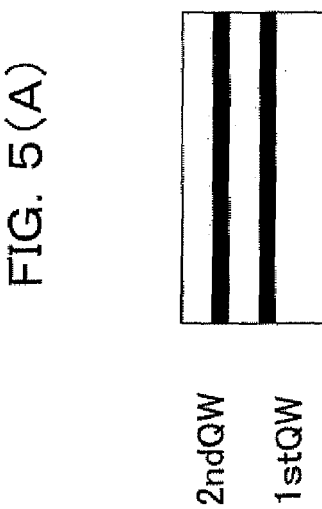
Figure 5B:
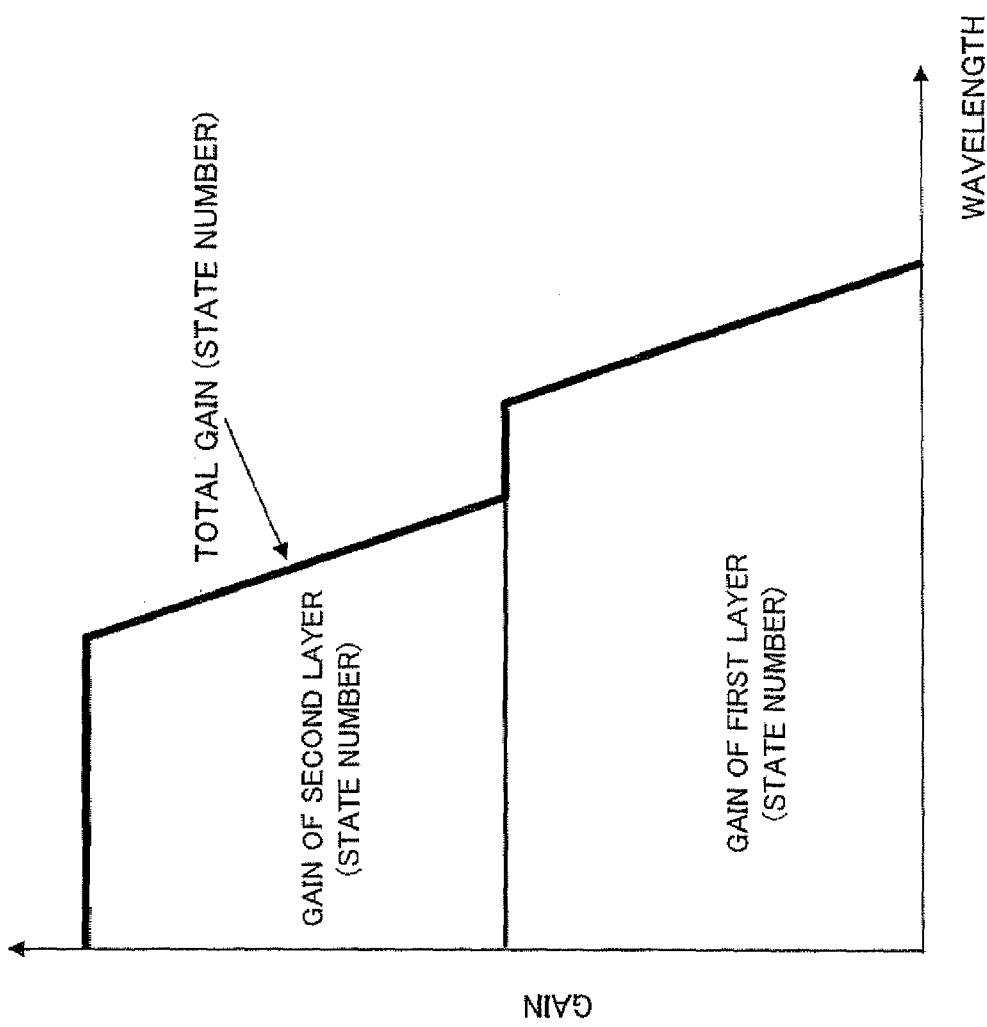

It is to be noted that, even if a plurality of quantum well layers (here, two layers 1st QW and 2nd QW) having energy gap wavelengths different from each other are stacked as shown in FIG. 5(A), the gain merely increases by addition of the gain (state number) of the first quantum well layer and the gain (state number) of the second quantum well layer as seen in FIG. 5(B). Therefore, it is difficult to achieve the uncooled configuration as described above.

Therefore, in the present embodiment, the quantum dot semiconductor device includes the active layer 11 formed by stacking the plural quantum dot layers 4A and 4B each formed from a composite quantum dot 2 and side barrier layers 93, and a plurality of different combinations of the stack number of quantum dots 1 and the magnitude of strain of the side barriers 3 are prepared and allocated to the quantum dot layers 4A and 4B. Consequently, the gain band (gain spectrum) of the active layer 11 and the central wavelength of the gain band as well as the polarization characteristic can be arbitrarily set to desired values.

Here, since each composite quantum dot 2 is formed by stacking a plurality of quantum dots 1, the height of the dots and the magnitude of strain of the side barrier layers 3 can be controlled accurately, and the gain band of the quantum dot layers 4A and 4B, the central wavelength of the gain band and the polarization characteristic can be accurately set to desired values. As a result, the gain band of the active layer 11 and the central wavelength of the gain band as well as the polarization characteristic can be accurately set to desired values.

Particularly, in the present embodiment, the stack number of the quantum dots 1 and the magnitude of strain of the side barrier layers 3 which form the quantum dot layers 4A and 4B are set so that the gain spectrum of the active layer 11 has a flat gain bandwidth (gain flat region; for example, the gain difference is within approximately 1 dB) corresponding to the shift amount of the gain spectrum within a desired operation temperature range.

For example, where the quantum dot SOA of the present embodiment operates within the temperature range from 25° C. (room temperature) to 85° C. [that is, where the operation temperature range is a range, for example, from 25° C. to 85° C.], the energy gap of the semiconductor material varies by the temperature variation, and the wavelength (energy gap wavelength) of the semiconductor material shifts to the long wavelength side by approximately 30 nm (shift amount: 30 nm) as seen in FIG. 6. It is to be noted that, in FIG. 6, a region to which a pattern is applied is a region which is filled with carriers.

Therefore, in the present embodiment, in order to compensate for the shift amount by the temperature variation, the stack number of the quantum dots 1 and the magnitude of strain of the side barrier layers 3 which form each of the quantum dot layers 4A and 4B are set so that the gain spectrum of the active layer 11 has a 30-nm bandwidth as the flat gain bandwidth corresponding to the shift amount of the gain spectrum within a desired operation temperature range (here, from 25° C. to 85° C.).

Here, since the operation wavelength is set to 1.55 µm, the stack number of the quantum dots 1 and the magnitude of strain of the side barriers 3 which form the quantum dot layers 4A and 4B are set so that, where the operation temperature is 25° C. (lower limit temperature of the operation temperature range), the energy gap wavelength at one end (end on the long wavelength side) of the flat gain band (bandwidth: 30 nm) of the gain spectrum of the active layer 11 becomes equal or close to approximately 1.55 µm (operation wavelength) and the band gap wavelength at the other end (end on the short wavelength side) becomes equal or close to approximately 1.52 µm (wavelength calculated by subtracting a band width corresponding to the shift amount from the operation wavelength).

In particular, where the operation temperature is 25° C. (lower limit temperature of the operation temperature range), the central wavelength of the gain spectrum of the quantum dot layer 4A becomes equal or close to approximately 1.52 µm (wavelength calculated by subtracting a band width corresponding to the shift amount from the operation wavelength) and the central wavelength of the gain spectrum of the other quantum dot layer 4B becomes equal or close to approximately 1.55 µm (operation wavelength). Further, the half-value width of the gain spectrum of the quantum dot layer 4A becomes approximately 30 nm and the half-value width of the gain spectrum of the quantum dot layer 4B becomes approximately 30 nm.

The quantum dot semiconductor device according to the present embodiment is described below in detail.

Figure 7:
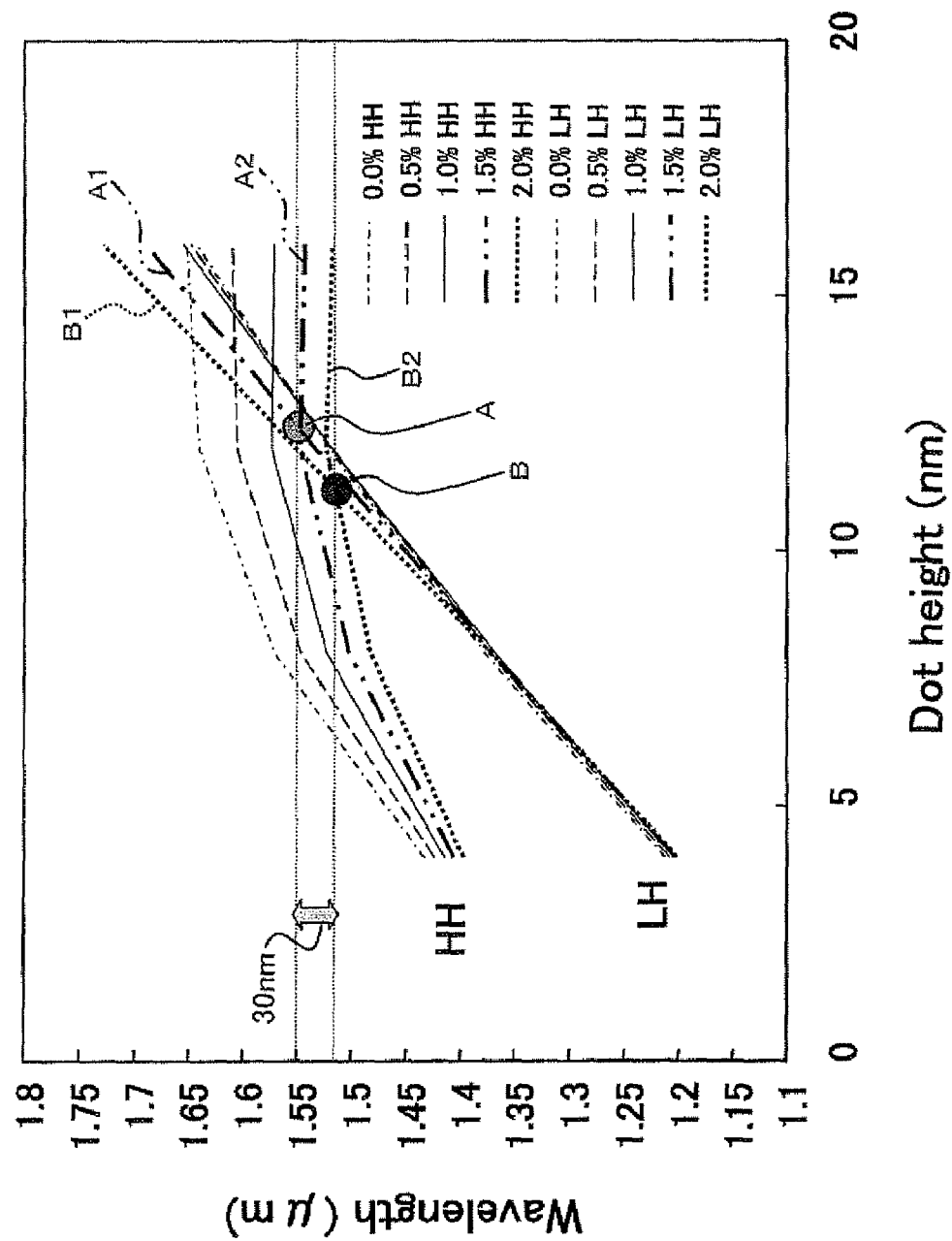
FIG. 7 is a diagram illustrating a relationship among the height of a composite quantum dot, the magnitude of strain of a side barrier layer and the energy gap wavelengths of a heavy-hole band and a light-hole band of the quantum dot semiconductor device according to the embodiment.

Here, FIG. 7 shows a relationship among the height of the composite quantum dot 2 (stack number of the quantum dots 1), the magnitude of strain of the side barrier layers 3 and the energy gap wavelengths of a heavy-hole band and a light-hole band (that is, the ground levels of the heavy-hole band and the light-hole band).

It is to be noted here that one quantum dot 1 is assumed to have the height of 1 nm. Further, here, the lattice constant of the side barrier layers 3 is varied from 0% to 2% successively by 0.5% to vary the magnitude of strain of the side barrier layers 3. Further, the temperature condition is set to 25° C.

In the present embodiment, the operation wavelength is set to 1.55 µm, and in order that the bandwidth of 30 nm is assured as the flat gain bandwidth and the polarization dependent gain difference falls within a desired range (for example, 0.5 dB), the height of the composite quantum dot 2 and the magnitude of strain of the side barrier layers 3 with which the band gap wavelengths of the heavy-hole band and the light-hole band individually become equal or close to approximately 1.52 µm are selected as the height of the composite quantum dot 2 and the magnitude of strain of the side barrier layers 3 which configure the quantum dot layer 4A (point denoted by reference character B in FIG. 7) while the height of the composite quantum dot 2 and the magnitude of strain of the side barrier layers 3 with which the band gap wavelengths of the heavy-hole band and the light-hole band individually become equal or close to approximately 1.55 µm are selected as the height of the composite quantum dot 2 and the magnitude of strain of the side barrier layers 3 which configure the quantum dot layer 4B (point denoted by reference character A in FIG. 7).

Here, as the height of the composite quantum dot 2 and the magnitude of strain of the side barrier layers 3 which configure the quantum dot layer 4A, the height of the composite quantum dot 2 and the magnitude of strain of the side barrier layers 3 at or in the proximity of an intersection point (point denoted by reference character B in FIG. 7) between a characteristic line (indicated by a dotted line B1 in FIG. 7) of the light-hole band and a characteristic line (indicated by a dotted line B2 in FIG. 7) of the heavy-hole band wherein the magnitude of strain of the side barrier layers 3 are same as each other are selected, respectively.

Consequently, the difference between the energy gap wavelength (that is, energy gap) of the heavy-hole band and the energy gap wavelength (that is, energy gap) of the light-hole band falls within the desired range, and as a result, the polarization dependent gain difference falls within the desired range (for example, within 0.5 dB).

Here, at the point indicated by reference character B in FIG. 7, the lattice constant of the side barrier layers 3 is lower by 2.0% than that of the substrate 10 (tensile strain: 2.0%) and the height of the composite quantum dot 2 is 11 nm as seen in FIG. 8. It is to be noted here that the energy gap wavelength of the heavy-hole band (HH) is 1,505 nm and the energy gap wavelength of the light-hole band (LH) is 1,519 nm. Further, the half-value width of the gain spectrum of the heavy-hole band is 33 meV in energy gap and the half-value width of the gain spectrum of the light-hole band is 40 meV in energy gap.

Therefore, in the present embodiment, the quantum dot layer 4A includes the composite quantum dot 2 (for example, 11 nm in height; 16 nm×16 nm in bottom area) formed by stacking eleven quantum dots (here, InAs quantum dots) 1.

Further, the side barrier layers 3 which form the quantum dot layer 4A include an $In_{0.30}Ga_{0.70}As_{0.327}P_{0.673}$ side barrier layer 6C [whose lattice constant is lower by 4.0% than that of the substrate 10 (tensile strain: 4.0%)] and an InAs wetting layer 6B [whose lattice constant is higher by 3.2% than that of the substrate 10 (compression strain 3.2%)], and the substantial lattice constant of the entire side barrier layers 3 is lower by 2.0% than that of the substrate 10 and the tensile strain is 2.0%.

On the other hand, as the height of the composite quantum dot 2 and the magnitude of strain of the side barrier layers 3 which configure the quantum dot layer 4B, the height of the composite quantum dot 2 and the magnitude of strain of the side barrier layers 3 at or in the proximity of an intersection point (point indicated by reference character A in FIG. 7) between a characteristic line (indicated by an alternate long and two short dashes line A1 in FIG. 7) of the light-hole band and a characteristic line (indicated by an alternate long and two short dashed line A2 in FIG. 7) of the heavy-hole band where the magnitudes of strain of the side barrier layers 3 are same as each other are selected.

Consequently, the difference between the energy gap wavelength (that is, energy gap) of the heavy-hole band and the energy gap wavelength (that is, energy gap) of the light-hole band falls within a desired range, and as a result, the polarization dependent gain difference falls within a desired range (for example, within 0.5 dB).

Here, at the point indicated by reference character A in FIG. 7, the lattice constant of the side barrier layers 3 is lower by 1.5% than that of the substrate 10 (tensile strain 1.5%) and the height of the composite dot 2 is 13 nm as seen in FIG. 8. It is to be noted here that the energy gap wavelength of the heavy-hole band (HH) is 1,565 nm and the energy gap wavelength of the light-hole band (LH) is 1,560 nm. Further, the half-value width of the gain spectrum of the heavy-hole band is 27 meV in energy gap and the half-value width of the gain spectrum of the light-hole band is 31 meV in energy gap.

Therefore, in the present embodiment, the quantum dot layer 4B includes a composite quantum dot 2 (for example, 13 nm high; 16 nm×16 nm in bottom area) formed by stacking thirteen quantum dots (here, InAs quantum dots) 1.

Further, the side barrier layers 3 which form the quantum dot layer 4B include an $In_{0.36}Ga_{0.64}As_{0.327}P_{0.673}$ side barrier layer 6A [whose lattice constant is lower by 3.5% than that of the substrate 10 (tensile strain: 3.5%)] and an InAs wetting layer 6B [whose lattice constant is higher by 3.2% than that of the substrate 10 (compression strain: 3.2%)], and the substantial lattice constant of the entire side barrier layers 3 is lower by 1.5% than that of the substrate 10 and the tensile strain is 1.5%.

It is to be noted that, while, since the quantum dot semiconductor device in the present embodiment includes the two quantum dot layers 4A and 4B, two points are selected, provision of such quantum dot layers is not limited to this, but, for example, where the quantum dot semiconductor device is configured as a device including three or more quantum dot layers as in a case wherein the flat gain bandwidth in the gain spectrum of one quantum dot layer is narrow, a number of points corresponding to the number of the quantum dot layers are selected.

Further, while, in the present embodiment, taking the polarization characteristic into consideration [that is, so that the polarization dependent gain difference falls within the desired range (for example, 0.5 dB)], the height of the composite quantum dot 2 and the magnitude of strain of the side barrier layers 3 at or in the proximity of the intersection points (indicated by reference characters A and B in FIG. 7) between the characteristic line of the light-hole band and the characteristic line of the heavy-hole band where the magnitudes of strain of the side barrier layers 3 are same as each other are selected, if the polarization characteristic need not be taken into consideration, then a height of the composite quantum dot 2 and a magnitude of strain of the side barrier layers 3 other than those at or in the proximity of the intersection points can be selected. However, it is necessary to set the stack number of the quantum dots 1 and the magnitude of strain of the side barrier layers 3 which configure the quantum dot layers 4A and 4B so that the gain spectrum of the active layer 11 has a flat gain bandwidth corresponding to the shift amount of the gain spectrum in the desired operation temperature range.

Further, while the heights of the composite quantum dots 2 (stack numbers of the quantum dots 1) in the present embodiment are different from each other, the heights of them are not limited to this, but the heights of the composite quantum dots 2 (stack numbers of the quantum dots 1) which configure the quantum dot layers 4A and 4B may be same as each other. Further, while the magnitudes of strain of the side barrier layers 3 in the present embodiment are different from each other, the magnitudes of them are not limited to this, but the magnitudes of strain of the side barrier layers 3 which configure the quantum dot layers 4A and 4B may be same as each other. However, it is necessary to configure the quantum dot layers 4A and 4B so that at least the heights of the composite quantum dots 2 (stack numbers of the quantum dots 1) or the magnitudes of strain of the side barrier layers 3 may be made different from each other.

In the present embodiment, all of the barrier layers 5 are configured as $In_{0.85}Ga_{0.15}As_{0.327}P_{0.673}$ barrier layers so as to lattice-match with the substrate 10.

By setting the stack number of the quantum dots 1 and the magnitude of strain of the side barrier layers 3 of the quantum dot layers 4A and 4B in such a manner as described herein above, a flat gain spectrum characteristic is obtained in the operation temperature range of the quantum dot SOA. In other words, a gain spectrum characteristic is obtained wherein the gain becomes flat only in the wavelength band accurately corresponding to the operation temperature range.

Figure 9:
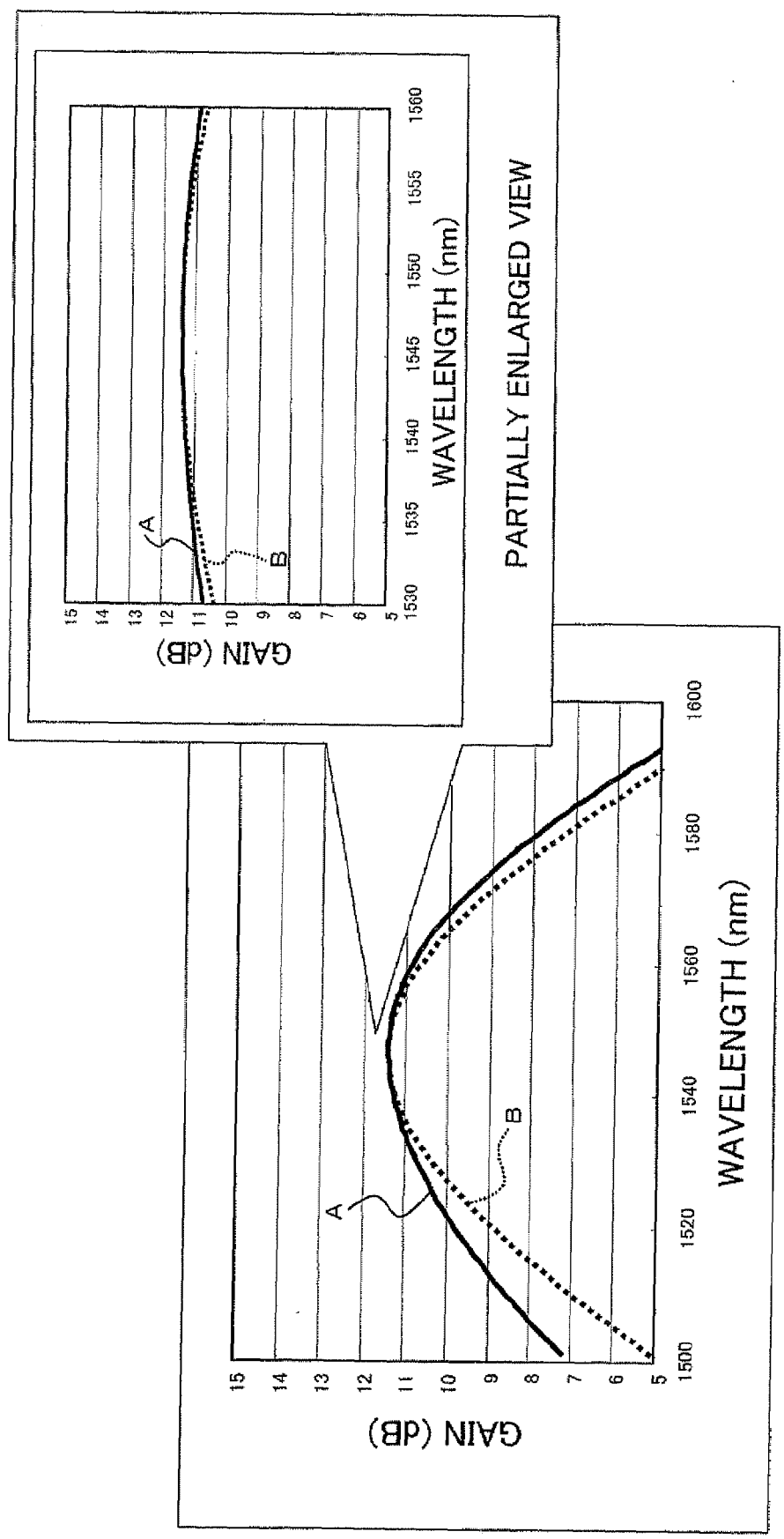
FIG. 9 is a view illustrating an effect of the quantum dot semiconductor device according to the embodiment.

Here, FIG. 9 shows a result when the gain characteristic of the device obtained where a layer formed by stacking the two quantum dot layers 4A and 4B set in such a manner as described is used as the active layer 11 is calculated. It is to be noted that, in FIG. 9, a solid line A indicates the gain of a TE mode and a dotted line B indicates the gain of a TM mode.

It can be recognized that, by configuring the quantum dot semiconductor device as described above, the gain becomes constant within a band of 30 nm from 1,530 nm to 1,560 nm (that is, the gain becomes within 1 dB) and also the polarization dependent gain difference becomes constant (that is, the polarization dependent gain difference becomes within 0.5 dB) as shown in FIG. 9. Consequently, the quantum dot SOA which sufficiently operates in an uncooled condition can be implemented.

Now, a fabrication method for the quantum dot SOA according to the present embodiment is described.

Here, crystal growth is carried out, for example, by a MOVPE method using, as source materials, trimethyl indium (TMIn), triethyl gallium (TEGa), arsine ($AsH_3$), phosphine ($PH_3$), triethyl zinc (TEZn) as a p-type impurity source, Monosilane ($SiH_4$) as a n-type impurity source, and hydrogen chloride (HCl) as source material for etching.

First, as shown in FIGS. 1 and 2, an n-type InP buffer layer (not shown) provided as occasion demands, an n-type InP lower cladding layer (not shown), and an InGaAsP barrier layer 5 made of $In_{0.85}Ga_{0.15}As_{0.327}P_{0.673}$ semiconductor mixed crystal which is to lattice-match with an InP substrate 10 are formed on the n-type InP substrate 10 having a (001) plane direction. Here, p-type impurity is doped when the InGaAsP barrier layer 5 is formed.

Then, as shown in FIG. 1, an InAs quantum dot 1 made of, for example, InAs semiconductor mixed crystal is formed on the barrier layer 5 at a substrate temperature (dot growth temperature) of 430° C. with a material supplying amount corresponding to approximately two molecular layers (2ML). In this instance, since the lattice constant of the semiconductor crystal which configures the quantum dot 1 is larger than that of the semiconductor crystal which configures the barrier layer 5 and there is a predetermined difference between the lattice constants, the InAs quantum dot 1 in the form of an island is formed and also an InAs wetting layer 6B (compression strain: 3.2%) is formed by S-K (Stranski-Krastanow) mode growth which appears at an initial stage of strain heteroepitaxial growth.

Next, as shown in FIG. 1, an InGaAsP side barrier layer 6C made of, for example, $In_{0.30}Ga_{0.70}As_{0.327}P_{0.673}$ semiconductor mixed crystal (tensile strain: 4.0%) is formed with a material supplying amount corresponding to that for one molecular layer (1ML) to four molecular layers (4ML) so that the quantum dot 1 is buried therein.

In this manner, the InGaAsP side barrier layer 6C (tensile strain 4.0%) is formed on the InAs wetting layer 6B (compression strain: 3.2%) and the side barrier layer 3 having tensile strain of 2.0% as substantial strain is formed.

After the side barrier layer 3 is formed in such a manner as described above, temperature annealing is performed at the substrate temperature of 500° C. and then the substrate temperature is set to 430° C. Consequently, the top of the quantum dot 1 is flattened so that the height of the quantum dot 1 and the thickness of the side barrier become effectively equal to each other.

Then, on the quantum dot 1 and the side barrier layer 3 formed in such a manner as described above, another InAs quantum dot 1 in the form of island and another side barrier layer 3 are formed similarly. Then, temperature annealing is carried out to form the quantum dot 1 whose surface is flattened and the side barrier layer 3. Thereafter, such steps as described above are repetitively carried out by a desired number of times so that a composite quantum dot 2 formed from a stack of a plurality of quantum dots 1 (here, eleven quantum dots 1; in FIG. 1, a stack of three quantum dots is shown for the convenience of illustration) is formed.

Here, where a next quantum dot 1 is formed on a quantum dot 1 and a side barrier layer 3 which are formed already, the next quantum dot 1 is likely to be formed just above the quantum dot 1 formed already such that the quantum dots 1 are joined upwardly and downwardly. Therefore, the next quantum dot 1 is formed on the quantum dot 1 formed already so that a composite quantum dot (quantum dot stack) 2 composed of a stack of the quantum dots 1 is formed. Further, an InGaAsP side barrier layer 6C is formed on the InAs wetting layer 6B so that the side barrier layer 3 composed of a stack of the InAs wetting layer 6B and the InGaAsP side barrier layer 6C is formed.

After the quantum dot layer 4A composed of the composite quantum dot 2 and the side barrier layer 3 is formed in such a manner as described above, another InGaAsP barrier layer 5 made of $In_{0.85}Ga_{0.15}As_{0.327}P_{0.673}$ semiconductor mixed crystal to lattice-match with the InP substrate 10 is formed on the quantum dot layer 4A as shown in FIG. 1. Here, p-type impurity is doped when the InGaAsP barrier layer 5 is formed.

Consequently, a structure is formed wherein the quantum dot layer 4A is sandwiched between the two barrier layers 5.

In the present embodiment, as shown in FIG. 1, steps similar to those described above are carried out to form a structure wherein a quantum dot layer 4B composed of composite quantum dots 2 formed from a stack of a plurality of quantum dots 1 (here, thirteen quantum dots 1; in FIG. 1, a stack of five quantum dots is shown for the convenience of illustration) and side barrier layers 3 is sandwiched between two barrier layers 5 is formed on the uppermost barrier layer 5 in the structure formed in such a manner as described above to form an active layer 11 having a two-layer structure wherein the two quantum dot layers 4A and 4B are stacked. It is to be noted here that, while the active layer 11 has a two-layer structure, the stack number of quantum dot layers is not limited to this.

Then, a p-type InP upper cladding layer 12 is formed on the active layer as seen in FIG. 2.

Thereafter, the stacked lower cladding layer (not shown), active layer 11 and upper cladding layer 12 are worked, for example, by etching to form a mesa structure.

Then, a p-type InP current blocking layer 13 and an n-type InP current blocking layer 14 are formed in order so as to bury the opposite sides of the mesa structure formed from the lower cladding layer (not shown), active layer 11 and upper cladding layer 12, and then, a p-type InP contact layer (not shown) is formed at least on the mesa structure.

Thereafter, an electrode (p-side electrode) 15 is formed on the upper face and another electrode (n-side electrode; not shown) is formed on the lower face, and an AR (Anti-Reflection) coat film (reflection preventing film; not shown) is formed individually on the opposite end faces of the mesa structure.

Accordingly, with the quantum dot semiconductor device (quantum dot SOA) according to the present embodiment, there is an advantage that, even if the temperature varies, the gain in the operation wavelength does not vary. Consequently, in the quantum dot semiconductor device, a temperature controlling mechanism need not be provided and an uncooled semiconductor device can be implemented.

It is to be noted that, while the quantum dot semiconductor device in the embodiment described above includes the two quantum dot layers 4A and 4B, the quantum dot semiconductor device is not limited to this, but the quantum dot semiconductor device can be configured as a device which includes, for example, three quantum dot layers 20 to 22 as shown in FIG. 10 or can be configured as a device which includes four or more quantum dot layers. It is to be noted that like elements to those in FIG. 10 are denoted by like reference characters to those of the embodiment described herein above.

Further, while, in the embodiment described above, the stack number of the quantum dots 1 and the magnitude of strain of the side barrier layers 3 where the operation wavelength and the operation temperature range are set to 1.5 μm and the range from 25° C. to 85° C., respectively, are described as an example, they are not limited to the specific ones described, but the stack number of the quantum dots and the magnitude of strain of the side barrier layer [that is, the composition (lattice constant) of the side barrier layer] may be set in response to a desired operation wavelength and a desired operation temperature range.

Further, while, in the embodiment described above, the present invention is applied where the semiconductor substrate 10 is an InP substrate having the (001) plane direction, the present invention is not limited to this, but can be applied also where the semiconductor substrate 10 is configured from a semiconductor substrate such as an InP substrate having the (111) plane direction or the (110) plane direction or a GaAs substrate.

Further, while, in the embodiment described above, the present invention is applied where the barrier layers 5 and the side barrier layers 3 are made of semiconductor crystal made of InGaAsP, the present invention is not limited to this, but can be applied also where the barrier layers 5 and the side barrier layers 3 are made of group III-V compound semiconductor mixed crystal containing In and Ga such as InGaAs, InAlGaAs, InAlGaP or GaInNAs.

Further, while, in the embodiment described above, the present invention is applied where the quantum dot 1 is made of InAs semiconductor crystal, the present invention is not limited to this, but can be applied also where the quantum dot 1 is made of, for example, InGaAsP, GaInNAs, GaAs semiconductor crystal or the like.

Further, while, in the embodiment described above, the buried waveguide type quantum dot SOA is taken as an example, the quantum dot SOA is not limited to this, but a ridge waveguide type quantum dot SOA may be formed.

Further, while, in the embodiment described above, the quantum dot semiconductor device is described taking a quantum dot SOA as an example, the quantum dot semiconductor device is not limited to this, but the present invention can be widely applied to semiconductor devices (quantum dot semiconductor device, optical semiconductor device) such as a semiconductor laser in which a quantum dot is used.

Further, while, in the embodiment described above, a p-type InGaAsP barrier layer is formed, the barrier layer is not limited to this, but, for example, an undoped InGaAsP barrier layer may be used.

Further, while, in the embodiment described above, a p-type InP layer and an n-type InP layer are used as buried layers, the buried layers are not limited to them, but, for example, a semi-insulating InP buried layer (high-resistance semiconductor layer) such as an Fe—InP layer may be used [SI-PBH (semi-insulating blocked planar buried heterostructure) structure or SI-BH (Semi-Insulating Buried Heterostructure) structure].

The present invention is not limited to the embodiment specifically described above, and variations and modifications can be made without departing from the scope of the present invention.

What is claimed is:

1. A quantum dot semiconductor device, comprising:
   an active layer having a plurality of quantum dot layers each including a composite quantum dot formed by stacking a plurality of quantum dots and a side barrier layer formed in contact with a side face of said composite quantum dot;
   the stack number of said quantum dots and the magnitude of strain of said side barrier layer from which each of said quantum dot layers is formed being set so that a gain spectrum of said active layer has a flat gain bandwidth corresponding to a shift amount of the gain spectrum within a desired operation temperature range.

2. The quantum dot semiconductor device as claimed in claim 1, wherein the stack numbers of said quantum dots from which said quantum dot layers are formed are different from each other.

3. The quantum dot semiconductor device as claimed in claim 1, wherein the magnitudes of strain of the side barrier layers from which each of said quantum dot layers is formed are different from each other.

4. The quantum dot semiconductor device as claimed in claim 1, wherein the stack number of said quantum dots and the magnitude of the strain of said side barrier layer from which each of said quantum dot layers is formed are set so that the difference between the energy gap in a heavy hole band and the energy gap in a light hole band is within a desired range.

5. The quantum dot semiconductor device as claimed in claim 1, wherein said side barrier layer includes a wetting layer.

6. The quantum dot semiconductor device as claimed in claim 1, wherein semiconductor crystal which forms said quantum dot layers is group III-V compound semiconductor crystal containing In and Ga.

7. The quantum dot semiconductor device as claimed in claim 6, wherein each of said quantum dots is made of InAs, and
   said side barrier layer is made of InGaAsP semiconductor mixed crystal.

8. The quantum dot semiconductor device as claimed in claim 1, further comprising a barrier layer provided between said quantum dot layers, and
   said quantum dot layers are stacked through said barrier layer.

9. The quantum dot semiconductor device as claimed in claim 8, wherein said active layer formed from said quantum dot layers and said barrier layer partly contain p-type impurity.

10. The quantum dot semiconductor device as claimed in claim 8, wherein semiconductor crystal which forms said barrier layer is group III-V compound semiconductor mixed crystal containing In and Ga.

11. The quantum dot semiconductor device as claimed in claim 10, wherein said barrier layer is made of InGaAsP semiconductor mixed crystal.

* * * * *